(12) United States Patent
Washio et al.

(10) Patent No.: US 9,910,089 B2
(45) Date of Patent: Mar. 6, 2018

(54) INSPECTION UNIT, PROBE CARD, INSPECTION DEVICE, AND CONTROL SYSTEM FOR INSPECTION DEVICE

(71) Applicant: Kabushiki Kaisha Nihon Micronics, Tokyo (JP)

(72) Inventors: Kenichi Washio, Tokyo (JP); Norie Yamaguchi, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 540 days.

(21) Appl. No.: 14/065,915

(22) Filed: Oct. 29, 2013

(65) Prior Publication Data

US 2014/0118018 A1   May 1, 2014

(30) Foreign Application Priority Data

Oct. 30, 2012   (JP) ................................. 2012-239418

(51) Int. Cl.
*G01R 31/28* (2006.01)
*G01R 1/073* (2006.01)

(52) U.S. Cl.
CPC ...... *G01R 31/2887* (2013.01); *G01R 1/07378* (2013.01)

(58) Field of Classification Search
CPC ............ G01R 31/2887; G01R 1/07378; G03F 7/70783
USPC .................................................. 324/756.03
See application file for complete search history.

(56) References Cited

U.S. PATENT DOCUMENTS

| 5,214,374 | A | * | 5/1993 | St. Onge | G01R 1/04 |
| | | | | | 324/754.15 |
| 7,071,715 | B2 | | 7/2006 | Shinde et al. | |
| 7,859,280 | B2 | | 12/2010 | Lee | |
| 2002/0005729 | A1 | * | 1/2002 | Leedy | G01R 1/07307 |
| | | | | | 324/750.05 |
| 2004/0012400 | A1 | * | 1/2004 | Sauk | G01R 31/2886 |
| | | | | | 324/754.03 |
| 2010/0013169 | A1 | * | 1/2010 | Monteen | H01L 21/6838 |
| | | | | | 279/3 |

(Continued)

FOREIGN PATENT DOCUMENTS

| CN | 102074825 A | 5/2011 |
| CN | 102478593 A | 5/2012 |

(Continued)

OTHER PUBLICATIONS

Office Action dated Nov. 20, 2015 for the corresponding Taiwanese Patent Application No. 102139069.

(Continued)

*Primary Examiner* — Patrick Assouad
*Assistant Examiner* — Khristopher Yodichkas
(74) *Attorney, Agent, or Firm* — Leason Ellis LLP

(57) ABSTRACT

An inspection unit in which a probe card is united with a connection body via a vacuum chamber. It prevents flatness of tips of probes provided on the probe card from worsening when the probe card is united with a connection body by suction force (negative pressure) of the vacuum chamber. The inspection unit includes a probe card with probes on a first surface and a connection body united with a second surface of the probe card via a first vacuum chamber. The first chamber is formed with a plurality of chambers.

17 Claims, 10 Drawing Sheets

(56) References Cited

U.S. PATENT DOCUMENTS

2011/0095779 A1* 4/2011 Washio .............. G01R 31/2887
324/756.05

FOREIGN PATENT DOCUMENTS

| JP | 2012-163410 A | 8/2012 |
|---|---|---|
| TW | 460918 B | 10/2001 |
| TW | I337661 B | 2/2011 |

OTHER PUBLICATIONS

Office Action dated May 19, 2016 for the corresponding Korean Application No. 10-2013-0129083.
Office Action dated Nov. 30, 2015 for the corresponding Korean Application No. 10-2013-0129083.
Office Action dated Oct. 30, 2015 for the corresponding Chinese Application No. 201310526787.0.
Office Action issued Nov. 21, 2016 for the corresponding Chinese Patent Application No. 201310526787.0.

* cited by examiner

INSPECTION UNIT, PROBE CARD, INSPECTION DEVICE, AND CONTROL SYSTEM FOR INSPECTION DEVICE

This application claims the benefit of Japanese Patent Application No. 2012-239418, filed Oct. 30, 2012, which is incorporated by reference in its entity herein.

FIELD OF THE INVENTION

The present invention relates to a contact inspection device for use in an energization test of semiconductor integrated circuits and so on.

BACKGROUND OF THE INVENTION

Conventionally, an energization test is performed on test objects, such as semiconductor integrated circuits, to determine whether or not the test objects are produced to the exact specification. An inspection device, to which an inspection unit provided with a probe card having probes which are pressed against respective electrodes of the test object is attached, is used in such an energization test. An inspection unit of this type is used to connect the electrodes of a test object to a tester electrically for inspection.

An inspection unit for use in such an energization test includes, a probe card having a plurality of probes to be brought into contact with a test object on a first surface, a pogo pin block located on the side of a second surface of the probe card, a wiring board located on the opposite side of the probe card with respect to the pogo pin block and electrically connected to the probes of the probe card via pogo pins extending through the pogo pin block, and a reference body located on the opposite side of the pogo pin block as a connection body with respect to the wiring board to prevent the probe card from being bent or distorted. The inspection unit is assembled by uniting the probe card, the pogo pin block, the wiring board, and the reference body, with fastening means.

The number of probes mounted on the probe card is at least several hundreds, and sometimes as many as several tens of thousands.

In the conventional probe described above, when inspection of a test object is repeated, an amount of protrusion from the probe card, i.e., height, is reduced due to wear or some other reason. Then, the worn probes cannot contact the corresponding electrodes of the test object.

The inspection unit cannot fulfill its full function as an inspection unit even when one probe does not contact the corresponding electrode of the test object due to wear or some other reason. In this case, the inspection unit must be replaced with a new one. However, the replacement of the entire inspection unit, including the pogo pin block, the wiring board, and the reference body, for wear of only one probe is such a waste considering efficient use of the component parts, and it places a significant economic burden on the user.

As a remedy, there is a test object inspection device in which the probe card is detachable from other constituent members of the inspection unit so that only the probe card, not the entire inspection unit, can be replaced (refer to Patent JP 2012-163410 A).

FIG. 1 of JP 2012-163410 A illustrates an inspection unit including the probe card supported by a card table at its periphery, the pogo pin block, the wiring board, and a performance board as the "reference body." In this inspection unit, the probe card is separable from the pogo pin block, the wiring board, and the performance board (reference body). The separable structure is as follows.

The probe card and the performance board (reference body) are united together by a suction force based on the negative pressure in a vacuum chamber formed therebetween. The probe card and the performance board (reference body) are united together when a negative pressure is created in the vacuum chamber, and the probe card and the performance board (reference body) become separable when the pressure in the vacuum chamber is returned to an atmospheric level.

The vacuum chamber is defined by a ring-shaped seal member provided between the probe card and the performance board (reference body). The seal member functions as a seal member when the probe card and the performance board (reference body) are brought into contact from a separated state. Then, when the space defined by the seal member, the probe card, and the performance board (reference body) is decompressed into a desired vacuum state (decompressed state) with a vacuum pump or the like, a vacuum chamber with a negative pressure is formed.

When the probe card and the performance board (reference body) is united together by the negative pressure, the relative position between the probe card and the performance board (reference body) is determined by an anchor (intermediate body) located between the probe card and the performance board.

When the probe card is replaced, the vacuum chamber is returned from the vacuum state to the atmospheric pressure, and the suction force created by the negative pressure disappears, making it possible to separate the probe card from the performance board (reference body). Therefore, the probe card can be replaced easily in the inspection unit.

Problem to be Solved by the Invention

In some cases, a plurality of intermediate bodies, i.e. anchors, are provided in an inspection unit as shown in FIG. 10(A). In such an inspection unit, the anchors $90a$, $90b$, $90c$, $90d$ may have variations in the length of protrusion from the probe card 92 due to problems of processing accuracy etc.

For example, referring to FIG. 10(A), when the anchors $90a$, $90b$, $90c$, $90d$ protrude from the probe card 92 toward the reference body 94, the anchors $90b$, $90c$, $90d$ may have a length of protrusion Z2 in the Z-axis direction, which is longer than the length of protrusion Z1 of the anchor $90a$ in the Z-axis direction. In such a case, when the probe card 92 is brought into contact with the reference body 94 via the anchors, the anchors $90b$, $90c$, $90d$ contact the reference body 94 whereas the anchor $90a$ does not contact the reference body 94.

When the anchors $90a$, $90b$, $90c$, $90d$ have different lengths of protrusion in the Z-axis direction, the degree of vacuum (suction force based on a negative pressure) necessary to unite the probe card 92 with reference body 94 is different depending on the lengths of protrusion of the anchors $90a$, $90b$, $90c$, $90d$.

In other words, the degree of vacuum necessary to bring the anchor $90a$ into contact with the reference body 94 is greater (higher) than the degree of vacuum necessary to bring the anchors $90b$, $90c$, $90d$ into contact with the reference body 94.

Referring to FIG. 10(B), the air in a space (vacuum chamber) 98 defined by the probe card 92, the reference body 94, and the seal member 96 is evacuated to create a negative pressure therein to unite the probe card 92 and the reference body 94 together. At this time, the anchors $90b$, 90c, 90d first come into contact with the reference body 94. However, the anchor 90a cannot be brought into contact with the reference body 94 with its degree of vacuum. When the degree of vacuum is increased, the anchor 90a can be brought into contact with the reference body 94.

However, because there is only one vacuum chamber, the following problem occurs. The length of protrusion of the anchors 90b, 90c, 90d does not change from Z2 to Z1. Thus, an excessive degree of vacuum (the degree of vacuum (negative pressure) corresponding to the length of protrusion Z1) is applied to the intermediate portions of the probe card 92 between the anchors 90b and 90c and between the anchors 90c and 90d. As a result, the "intermediate portions" are pulled and bent toward the reference body 94.

Thus, because the probe card 92 is partially bent in the Z-axis direction, the flatness of the probe card 92 worsens as a whole. As a result, the tips of the probes protruding from the probe card 92 toward the test object are also deviated vertically. Then, the flatness of the XY plane formed by the tips of the probes may worsen so as not to meet a prescribed requirement (such as 30 μm or less), making it impossible to carry out the inspection of the test object.

An object of the present invention is, in an inspection unit in which a probe card is united with a connection body via a vacuum chamber, to prevent the flatness of tips of probes provided on the probe card from worsening when the probe card is united with the connection body based on the degree of vacuum (negative pressure) in the vacuum chamber.

SUMMARY OF THE INVENTION

Means for Solving the Problem

For the purpose of accomplishing the above object, an inspection unit according to a first aspect of the present invention includes, a probe card having a probe on a first surface thereof, and a connection body united with a second surface of the probe card via a first vacuum chamber, in which the first vacuum chamber is formed with a plurality of chambers.

According to this aspect, because the first vacuum chamber between the probe card and the connection body is formed with the plurality of vacuum chambers, a degree of vacuum can be set individually for each vacuum chamber. Thus, a degree of vacuum which does not deform the probe card can be created individually in each vacuum chamber as compared to the case where the first vacuum chamber is constituted as a single vacuum chamber. Thus, the flatness of the tips of the probes provided on the probe card can be prevented from getting worse.

The "probe card" in this specification does not include a pogo pin block, a wiring board, and a reference body, and is primarily formed with a wiring board that includes a plurality of probes on one surface.

The "connection body" typically means the pogo pin block, but the term may be also used to refer to the reference body.

The inspection unit according to a second aspect of the present invention is characterized, in the first aspect, in that the first vacuum chamber is formed such that the degrees of vacuum in the vacuum chambers can be individually controlled.

According to this aspect, because the degrees of vacuum in the vacuum chambers can be individually controlled in the inspection unit, a degree of vacuum necessary to attract the connection body can be set in each vacuum chamber. Thus, because no extra pressure is applied to the probe card where the vacuum chambers are provided, portions in the probe card where the vacuum chambers are provided can be prevented from being deformed. Thus, the flatness of the tips of the probes provided on the probe card can be prevented from getting worse.

The inspection unit according to a third aspect of the present invention is characterized, in the first or second aspect, by further comprising: a pressure sensor provided in each vacuum chamber of the first vacuum chamber; and means for adjusting the degree of vacuum in each vacuum chamber to a degree of vacuum set for each vacuum chamber using a detection value detected by the pressure sensor.

According this aspect, each vacuum chamber of the first vacuum chamber is provided with a pressure sensor and adjusting means. Thus, when the value detected in any of the vacuum chambers is smaller or greater than the set value, the degree of vacuum in the vacuum chamber can be adjusted to the set value by using the adjusting means. In other words, because the degree of vacuum in each vacuum chamber can be maintained at a set value, the probe card is prevented from being deformed, and the flatness of the tips of the probes can be maintained.

The phrase "degree of vacuum set for each vacuum chamber" in the "for adjusting the degree of vacuum in each vacuum chamber to a degree of vacuum set for each vacuum chamber" means a certain range of degree of vacuum, in which the flatness of the tips of the probes can be maintained.

In the inspection unit according to the third aspect of the present invention, the vacuum chambers of the first vacuum chamber may be arranged at regular intervals. In addition, the probe card may be of a circular shape, and the vacuum chambers of the first vacuum chamber may be arranged circumferentially at regular intervals.

The inspection unit according to a fourth aspect of the present invention further includes, in any one of the first to third aspects, a plane reference body, which is located on the opposite side of the probe card with respect to the connection body and which includes a flat surface facing the connection body, in which the probe card includes a plurality of first reference bodies protruding from the second surface toward the plane reference body, the plane reference body includes a plurality of second reference bodies protruding from the flat surface toward the probe card, and the first reference bodies are brought into contact with the second reference bodies to determine the relative position between the probe card and the plane reference body.

According to this aspect, the position of the probe card relative to the plane reference body is determined via the first reference bodies and the second reference bodies. As a result, the relative position between the probe card corresponding to the vacuum chambers and the plane reference body corresponding to the vacuum chamber is determined.

The degrees of vacuum in the vacuum chambers are individually adjusted with the probe card, which is united with the connection body, by the negative pressures in the vacuum chambers. Thus, the probe card is not partially bent but can maintain its flatness. Thus, because the relative position of the probe card is determined via the first reference bodies and the second reference bodies, the probe card follows the flat surface of the plane reference body. In other words, the probe card has the same flatness as the flat surface of the plane reference body.

The inspection unit according to the fifth aspect of the present invention is characterized, in the fourth aspect, in that the connection body and the plane reference body are united together via a second vacuum chamber.

According to this aspect, because the connection body is attached to the plane reference body via the second vacuum chamber, the connection body can be easily removed from the plane reference body.

The inspection unit according to a sixth aspect of the present invention is characterized, in the fifth aspect, in that the second vacuum chamber is formed with a plurality of chambers.

According to this aspect, because the second vacuum chamber is formed with a plurality of chambers, the suction force by which the connection body is attached to the plane reference body can be adjusted when the connection body is removed from the plane reference body. Thus, the connection body is prevented from suddenly coming off from the plane reference body when the connection body is removed from the plane reference body. As a result, fears of the connection body and the second reference body being damaged can be reduced.

The inspection unit according to a seventh aspect of the present invention is characterized, in the sixth aspect, in that the first vacuum chamber and the second vacuum chamber are communicated with each other.

According to this aspect, because the vacuum chambers of the first vacuum chamber are communicated with the corresponding vacuum chambers of the second vacuum chamber, when pressure sensors and/or adjusting means are provided, the number of the pressure sensors and/or adjusting means can be reduced to simplify the constitution of the inspection unit.

In the seventh aspect of the present invention, the vacuum chambers of the first vacuum chamber and the vacuum chambers of the second vacuum chamber may be arranged in a plane-symmetric relationship. Alternatively, the vacuum chambers of the first vacuum chamber and the vacuum chambers of the second vacuum chamber may be arranged in an asymmetric relationship with respect to the connection body. In addition, when the vacuum chambers of the first vacuum chamber and the vacuum chambers of the second vacuum chamber are arranged in a plane-symmetric relationship, the connection body may have communication holes for communicating the vacuum chambers of the first vacuum chamber with the corresponding vacuum chambers of the second vacuum chamber arranged in a plane-symmetric relationship with the vacuum chambers of the first vacuum chamber.

The inspection unit according to an eighth aspect of the present invention is characterized, in any one of the first to seventh aspects, in that the probe card and the connection body are separable from each other.

According to this aspect, because the probe card is separable from the connection body, when the probes have become worn, only the probe card can be replaced in the inspection device. Thus, the economic efficiency of the inspection device can be increased.

A probe card according to a ninth aspect of the present invention is a probe card that includes: a first surface on which probes are mounted; and a second surface to be united with a connection body via a plurality of vacuum chambers set to have respective degrees of vacuum, in which the probe card includes set values of degree of vacuum for respective vacuum chambers determined during the production process of the probe card.

The "set values of degree of vacuum for respective vacuum chambers" are values determined during the production process of the probe card. Specifically, the degrees of vacuum in the vacuum chambers, detected by pressure sensors when the first reference bodies are brought into contact with the second reference bodies using a jig that can create an environment similar to the measurement environment of the inspection device during the production process of the probe card, are used as the set values of degree of vacuum in the vacuum chambers. The set values are determined in a range, in which the flatness of the probe card can be maintained in an appropriate condition.

The phrase "includes set values of degree of vacuum for respective vacuum chambers" means that the set values of degree of vacuum are provided to the user, who uses the probe card together with the probe card, in a printed or electronic medium or via telecommunication means.

According to this aspect, because the probe card has set values to which the degrees of vacuum in the vacuum chambers should be adjusted when the probe card is united with the connection body, the flatness of the probe card can be maintained in a proper condition when the user simply attaches the probe card to the inspection device to make the degrees of vacuum in the vacuum chambers equal to the set values of degree of vacuum. In addition, when the probe card is used in a plurality of inspection devices, there is no need to set the degrees of vacuum in the vacuum chambers in each inspection device. Thus, the efficiency of the installation of the probe card can be improved.

An inspection device according to a tenth aspect of the present invention includes: an inspection unit according to any one of first to eighth aspects; a prober including a stage, on which a test object to be brought into contact with the probe of the probe card is mounted; and a tester electrically connected to the plane reference body; in which the probe card of the inspection unit is attached to the prober.

According to this aspect, the same effects as those of any one of the first to eighth aspects can be achieved in this inspection device.

In the tenth aspect of the present invention, the vertical position of the probe card attached to the prober preferably determines the vertical position of the inspection unit relative to the stage.

A control system for inspection devices according to an eleventh aspect of the present invention includes a plurality of inspection devices as set forth in the tenth aspect of the invention, and a control part for controlling the inspection devices, in which the control part includes a set value of degree of vacuum for each of the vacuum chambers of the first vacuum chamber in the inspection unit according to any one of the first to eighth aspects of the present invention, and the degree of vacuum in each of the respective vacuum chambers is set based on the set value when the inspection unit is attached to the inspection device.

According to this aspect, because the set values of degree of vacuum for the vacuum chambers of the first vacuum chamber of the probe card can be shared by a plurality of inspection devices, the efficiency in setting the degrees of vacuum can be increased when the probe card is transferred from one inspection device to another, for example.

BRIEF DESCRIPTION OF THE DRAWINGS

These and other features and advantages of the present invention will become more readily appreciated when considered in connection with the following detailed description and appended drawings, wherein like designations denote like elements in the various views, and wherein.

DETAILED DESCRIPTION OF THE INVENTION

Embodiment for Carrying Out the Invention

Figure 1:
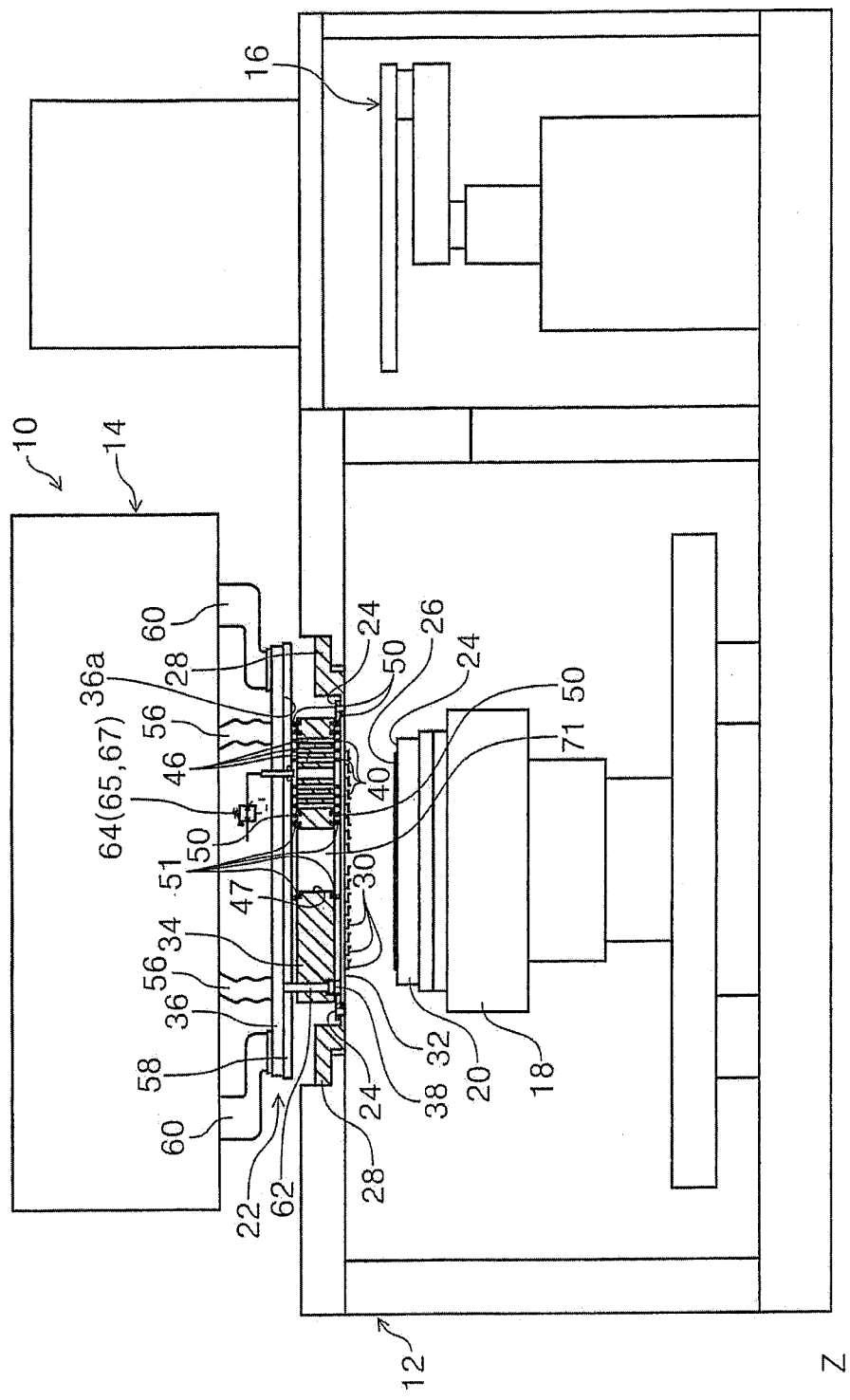
FIG. 1 is a side view of an inspection device including a probe card according to a first embodiment of the present invention.

Description is hereinafter made of embodiments of the present invention based on the drawings. The common constituent elements in all the embodiments, which are designated by the same reference numerals, are described only in the first embodiment and their description is omitted in the subsequent embodiments.

First Embodiment

[Inspection Unit and Inspection Device]

The constituent elements of an inspection device 10 are described with reference to FIG. 1. The inspection device 10 includes a prober 12, a tester 14, and a test object transport mechanism 16. The prober 12 includes an inspection stage 18 as a "stage," a chuck top 20, and an inspection unit 22.

The inspection stage 18 is constituted by combining an X-stage, a Y-stage, a Z-stage, and a θ-stage. The chuck top 20 is mounted on top of the inspection stage 18. Thus, the chuck top 20 is positionally adjustable in an X-axis direction, a Y-axis direction which is orthogonal to the X-axis direction on a horizontal plane, and a Z-axis direction which is vertical to the horizontal plane (XY plane). Also, the chuck top 20 is rotationally adjustable in a θ-direction about the Z-axis.

A mounting surface 24, on which a test object 26 is mounted, is provided on the chuck top 20. In this embodiment, the test object 26 is a semiconductor wafer into which a multiplicity of integrated circuits is incorporated.

The test object transport mechanism 16 is able to transport a test object 26 onto and off the mounting surface 24 of the chuck top 20. Specifically, the test object transport mechanism 16 transports a test object 26 onto and off the mounting surface 24 when the mounting surface 24 of the chuck top 20 is away, in other words, at a distance in the Z-axis direction, from the inspection unit 22 (which is described later) located above the mounting surface.

The inspection unit 22, which is attached to the prober 12 via a card holder 28, is located above the mounting surface 24 of the chuck top 20. In addition, the tester 14, which is electrically connected to the inspection unit, is located above the inspection unit 22. The tester 14 is movable in the Z-axis direction.

The tester 14 supports a pogo pin block 34 and a plane reference body 36 (which are described later) for swinging movement relative to a probe card 32, so that the pogo pin block 34 and the plane reference body 36 are assembled to the probe card 32 in the same position as the probe card 32 is attached to the prober 12.

The inspection device 10 moves the chuck top 20 toward the inspection unit 22, and applies electric current to a test object 26 mounted on the mounting surface 24 for inspection with electrodes of the test object 26 held in contact with respective probes 30 (which are described later) of the inspection unit 22.

Figure 2:
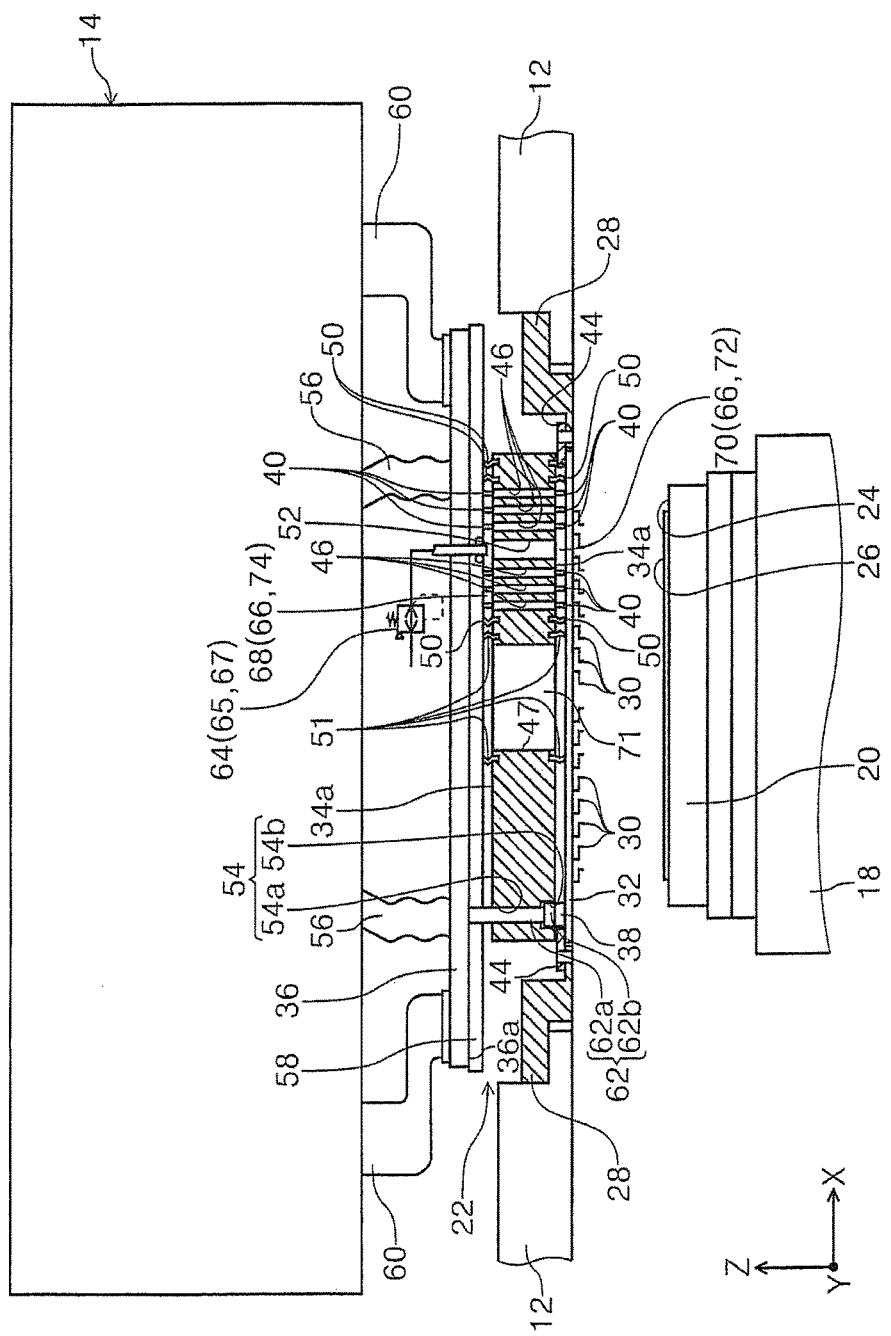
FIG. 2 is a side view of an inspection unit and a chuck top of the inspection device according to the first embodiment.

The constitution of the inspection unit 22 is next described with reference to FIG. 2 and FIG. 3. The inspection unit 22 includes the probe card 32, the pogo pin block 34 as a "connection body," and the plane reference body 36.

In this embodiment, the probe card 32 has a disk-like (circular) shape, and is constituted as a multi-layer board including a ceramic plate and a wiring board (not shown). The probe card 32 includes a plurality of probes 30 on its surface (first surface) facing the mounting surface 24 of the chuck top 20. The probe card 32 also includes a plurality of anchor portions 38 as "first reference bodies" protruding therefrom in the +Z direction on its surface (second surface) facing the pogo pin block 34. The anchor portions 38 have a circular columnar shape.

Figure 4:
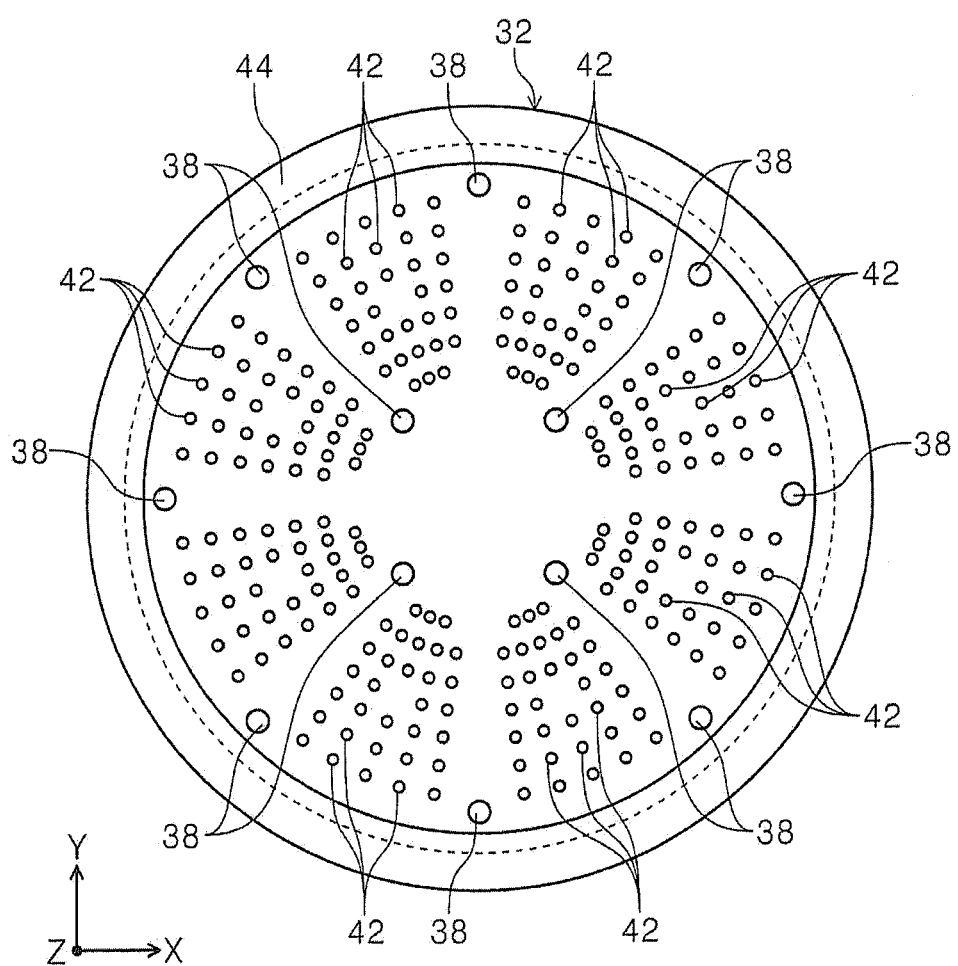
FIG. 4 is a plan view of a probe card according to the first embodiment.

Although not shown, the probe card 32 includes therein a plurality of electric paths. First ends of the electric paths are connected to respective probes 30, and second ends of the electric paths are connected to respective connection lands 42 (refer to FIG. 4) arranged on the surface (second surface) of the probe card 32 facing the pogo pin block 34 corresponding to pogo pins 40 of the pogo pin block 34 on the XY plane.

In addition, a probe card's height-and-flatness reference portion 44 is provided along an outer periphery of the probe card 32. The probe card's height-and-flatness reference portion 44 is in engagement with the card holder 28. The probe card's height-and-flatness reference portion 44 determines the vertical position of the probe card 32 relative to the chuck top 20 when the probe card 32 is attached to the prober 12.

The constitution of the pogo pin block 34 is described in detail with reference to FIG. 5(A). The pogo pin block 34 is a member for electrically connecting the probes 30 of the probe card 32 to respective electrodes (not shown) of a printed circuit board 58. The pogo pin block 34 supports a plurality of pogo pins 40. The pogo pin block 34 has the shape of a thick disk. The pogo pin block 34 includes a plurality of pogo pin insertion holes 46. The pogo pin block 34 includes, at its center, a through hole 47 extending vertically (in the Z-axis direction in FIG. 5(B)).

The pogo pin insertion holes 46 extend vertically through the pogo pin block 34. Each pogo pin 40 includes upper and lower ends, which protrude upward and downward from the pogo pin block 34, when inserted into a pogo pin insertion hole 46.

Figure 5:
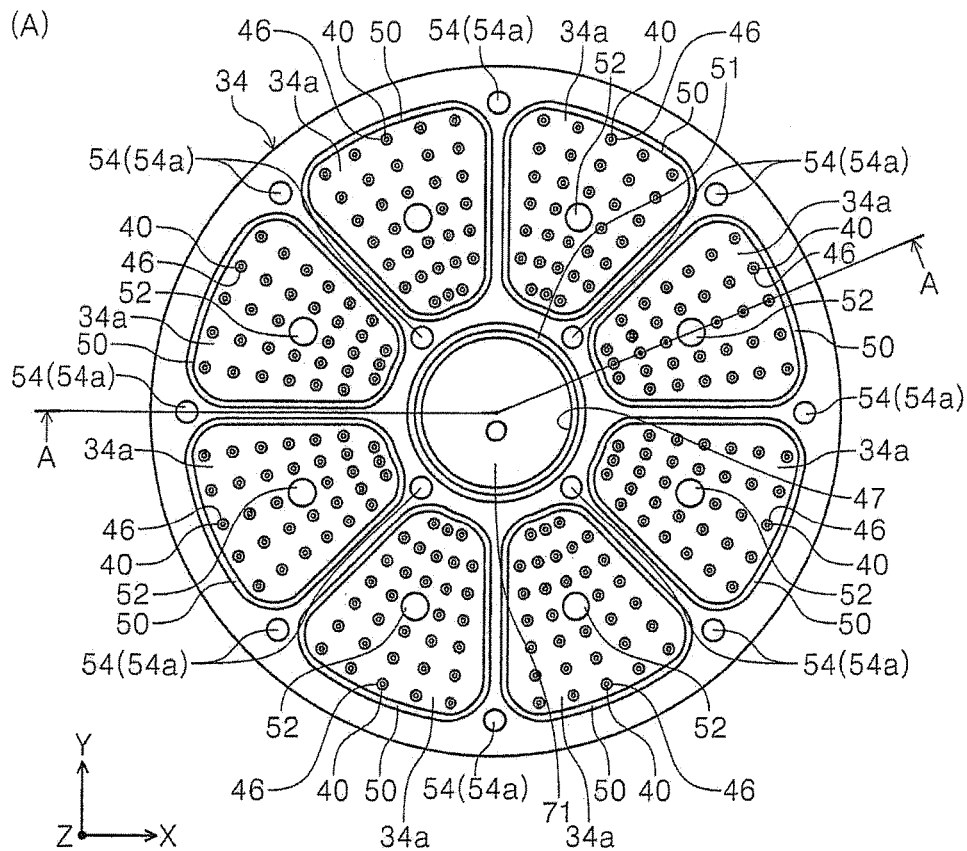
FIG. 5(A) is a plan view of the connection body according to the first embodiment.
FIG. 5(B) is a cross-sectional view taken along the line A-O-A in FIG. 5(A).
Figure 5:
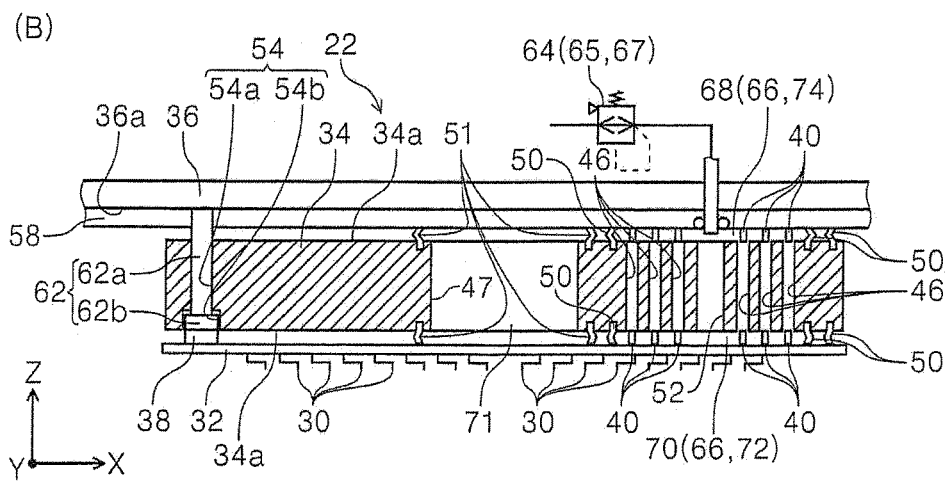

The pogo pin insertion holes 46 are arranged in the pogo pin block 34 to form a plurality of regions 34a on the XY plane as shown in FIG. 5(A). A seal member 50 is provided on the pogo pin block 34 to surround each region 34a. The regions 34a are arranged circumferentially at regular intervals on the pogo pin block 34. An annular seal member 51 is provided on each of the upper and lower surfaces of the pogo pin block 34 to surround the through hole 47.

In this embodiment, the regions 34a are formed on both of the upper and lower surfaces of the pogo pin block 34 in the Z-axis direction. The regions 34a formed on the upper surface of the pogo pin block 34 correspond to the regions 34a formed on the lower surface of the pogo pin block 34. In other words, the regions 34a are arranged in a plane-symmetric relationship on the upper and lower surfaces of the pogo pin block 34.

In addition, each region 34a formed on the upper surface of the pogo pin block 34 is communicated with the corresponding region 34a formed on the lower surface of the pogo pin block 34 via a communication hole 52.

In addition, the pogo pin block 34 includes a plurality of through holes 54 extending vertically through the pogo pin block 34. The through holes 54 are formed in the pogo pin block 34 at locations corresponding to the anchor portions 38 of the probe card 32. Each through hole 54 includes a small-diameter portion 54a on the upper surface side and a large-diameter portion 54b on the lower surface side. The small-diameter portions 54a have a diameter smaller than that of the anchor portions 38, and the large-diameter portions 54b have a diameter greater than that of the anchor portions 38.

The constitution of the plane reference body 36 is described in detail with reference to FIG. 2, FIG. 3, and FIG. 5(B). The plane reference body 36 has a disk-like shape and is formed of a metal member. Tester dampers 56 of the tester 14 are connected to an upper surface of the plane reference body 36 in the Z-axis direction in FIG. 2 and FIG. 3, whereby the plane reference body 36 is supported for swinging movement relative to the tester 14.

The plane reference body 36 includes a lower surface formed as a flat surface 36a. The flat surface 36a of the plane reference body 36 is formed to satisfy a prescribed flatness requirement (such as 30 μm or less). In addition, the printed circuit board 58 is provided on the lower surface of the plane reference body 36. Electrodes (not shown) are provided on a lower surface of the printed circuit board 58 at locations corresponding to the pogo pins 40 of the pogo pin block 34.

A plurality of electrodes (not shown) is provided on the upper surface of the plane reference body 36, and electrically connected to the tester 14 via connection cables 60. Electric paths (not shown) are provided in the plane reference body 36 and the printed circuit board 58. First ends of the electric paths are connected to the respective electrodes on the lower surface of the printed circuit board 58, and second ends of the electric paths are connected to the respective electrodes on the upper surface of the plane reference body 36.

In addition, a plurality of anchor receivers 62 as "second reference bodies" extends downward from the lower surface of the plane reference body 36 through the printed circuit board 58. The anchor receivers 62 are provided on the lower surface of the plane reference body 36 corresponding to the positions of the anchor portions 38 of the probe card 32 on the XY plane. Each anchor receiver 62 includes a columnar portion 62a extending from the lower surface of the plane reference body 36, and an anchor abutment portion 62b provided at the tip of the columnar portion 62a. The columnar portion 62a and the anchor abutment portion 62b have a circular columnar shape.

The columnar portions 62a and the anchor abutment portions 62b are fitted in the small-diameter portions 54a and the large-diameter portions 54b, respectively, of the through holes 54 of the pogo pin block 34. The anchor abutment portions 62b have a diameter greater than that of the small-diameter portions 54a of the through holes 54. Thus, when the pogo pin block 34 is going to move away from the plane reference body 36, the small-diameter portions 54a are brought into contact with the anchor abutment portions 62b to prevent the motion of the pogo pin block 34.

In other words, when the pogo pin block 34 is attached to the plane reference body 36 (refer to FIG. 3), the pogo pin block 34 is able to move toward and away from the plane reference body 36 within a prescribed range. In addition, the columnar portions 62a are fitted in the small-diameter portions 54a of the through holes 54, whereby the positions of the pogo pin block 34 and the plane reference body 36 on the XY plane are determined.

The plane reference body 36 includes a plurality of pressure adjusting means 64 as "means for adjusting the degree of vacuum" at locations corresponding to the regions 34a formed on the upper surface of the pogo pin block 34. Each pressure adjusting means 64 includes, a pressure sensor 65 for detecting the pressure in a vacuum chamber 66 (which is described later) that is formed on the corresponding one of the regions 34a, and a vacuum regulator 67 for adjusting the degree of vacuum in the vacuum chamber 66 based on a detection value from the pressure sensor.

The procedure by which the probe card 32, the pogo pin block 34, and the plane reference body 36 are united in the inspection unit 22 is described with reference to FIG. 2, FIG. 3, and FIG. 5(B).

Figure 3:
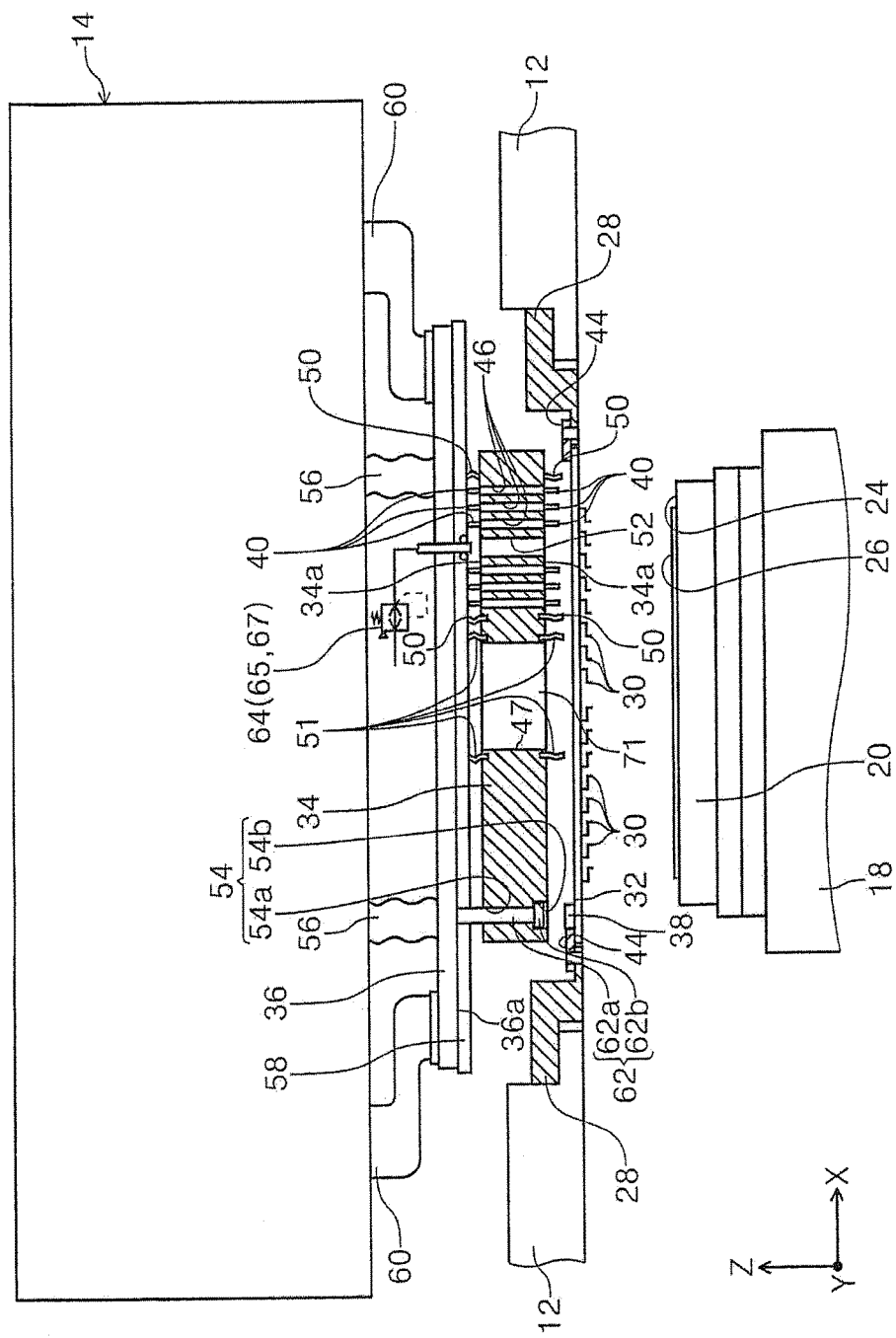
FIG. 3 is a side view illustrating a state in which a probe card and a connection body have been separated in the inspection device according to the first embodiment.

In the state shown in FIG. 3, the probe card 32 has been attached to the prober 12 via the card holder 28. The pogo pin block 34 and the plane reference body 36 are supported by the tester 14 via the tester dampers 56. Here, the pogo pin block 34 is suspended from the plane reference body 36 while the small-diameter portions 54a are held in contact with the anchor abutment portions 62b by gravity.

At this time, the seal members 50 surrounding the regions Ma formed on the upper surface of the pogo pin block 34 are held in contact with the printed circuit board 58, and also in contact with the plane reference body 36. Thus, spaces 68 surrounded by the seal members 50 are formed at locations corresponding to the regions 34a between the pogo pin block 34 and the plane reference body 36. At this time, the seal member 51 on the upper surface of the pogo pin block 34 is held in contact with the printed circuit board 58.

Then, the pogo pin block 34 and the plane reference body 36 supported by the tester 14 are moved toward the probe card 32. At this time, the pressure adjusting means 64 are activated to evacuate the air in the spaces 68. Then, when the pogo pin block 34 and the plane reference body 36 are moved downward by the tester 14, the seal members 50 surrounding the regions 34a formed on the lower surface of the pogo pin block 34 are brought into contact with the probe card 32.

As a result, spaces 70 surrounded by the seal members 50 are formed at locations corresponding to the regions 34a formed on the lower surface of the pogo pin block 34 between the probe card 32 and the pogo pin block 34. At this time, the seal member 51 on the lower surface of the pogo pin block 34 is also brought into contact with the probe card 32, whereby a space 71 surrounded by the seal members 51 is formed in the through hole 47.

While the pressure adjusting means 64 continue to evacuate the air in the spaces 68 and the spaces 70 communicated with the spaces 68, the pogo pin block 34 and the plane reference body 36 are moved downward by the tester 14, until the anchor portions 38 of the probe card 32 come into contact with the anchor abutment portions 62b of the anchor receivers 62 of the plane reference body 36. The air in the space 71 is also evacuated by another pressure adjusting means (not shown).

When any one of the anchor portions 38 comes into contact with its corresponding anchor abutment portion 62b, the contact between the anchor portion 38 and the anchor abutment portion 62b is detected by signal detection means (not shown). Upon the detection, the degree of vacuum (negative pressure) in the spaces (vacuum chambers) 68 and 70 adjacent to the anchor portion 38 which is in contact with its corresponding anchor abutment portion 62b is measured by the corresponding pressure sensor 65.

Then, the vacuum regulator 67 of the pressure adjusting means 64, which evacuates the air in the spaces 68 and 70 adjacent to the anchor portion 38 which is in contact with the anchor abutment portion 62b, maintains the degree of vacuum (negative pressure) in the spaces 68 and 70 at the same degree as detected. Also, upon the detection, the pressure adjusting means corresponding to the space 71 maintains the degree of vacuum (negative pressure) in the space 71 at the same degree as detected. In order to prevent an adverse effect on the flatness of the probe card 32, the degree of vacuum (negative pressure) in the space 71 is set to be equal to or lower than the degree of vacuum (negative pressure) in the spaces 68 and 70, where the degree of vacuum is maintained by the above detection.

Every time an anchor portion 38 comes into contact with its corresponding anchor abutment portion 62b, the corresponding pressure sensor 65 measures the degree of vacuum (negative pressure) in the spaces (vacuum chambers) 68 and 70 adjacent to the anchor portion 38 which is in contact with its corresponding anchor abutment portion 62b. The vacuum regulator 67 maintains the degree of vacuum (negative pressure) in the corresponding spaces (vacuum chambers) 68 and 70 at the level at the same degree as detected. When all the anchor portions 38 come into contact with the corresponding anchor abutment portions 62b, the downward movement of the tester 14 is stopped.

When the anchor portions 38 come into contact with the anchor abutment portions 62b, the large-diameter portions 54b of the through holes 54 receive the anchor portions 38 to determine the position of the probe card 32 and the pogo pin block 34 on the XY plane.

In this embodiment, the signal detection means (not shown) is capable of detecting a signal, because electric paths formed in an anchor portion 38 and its corresponding anchor abutment portion 62b are electrically connected to each other to allow a current to flow when they comes into contact with each other.

Here, the spaces 68 and 70 are in a vacuum state (decompressed state) as the air in the spaces 68 and 70 has been evacuated. Each pressure adjusting means 64 detects the degree of vacuum in the corresponding space 70 with its pressure sensor 65 when evacuation of air in the space 70 is stopped. As a result of the contact between the anchor portions 38 and the anchor abutment portions 62b, the relative position between the probe card 32 and the plane reference body 36 is determined.

In this way, the spaces 70 are brought into a vacuum state between the probe card 32 and the pogo pin block 34. As a result, the spaces 70 in a vacuum state serve as vacuum chambers of a first vacuum chamber 72. Similarly, the spaces 68 are brought into a vacuum state between the pogo pin block 34 and the plane reference body 36. As a result, the spaces 68 in a vacuum state serve as vacuum chambers of a second vacuum chamber 74. The probe card 32 is united with the pogo pin block 34 via the first vacuum chamber 72, and the pogo pin block 34 is united with the plane reference body 36 via the second vacuum chamber 74.

The first vacuum chamber 72 is formed with a plurality of spaces 70, in other words, a plurality of vacuum chambers. Thus, a degree of vacuum (negative pressure) can be set for each vacuum chamber in the first vacuum chamber 72 by the corresponding pressure adjusting means 64. Thus, there is no possibility that the degree of vacuum (negative pressure) is increased more than necessary in each vacuum chamber. Similarly, the second vacuum chamber 74 is formed with a plurality of spaces 68, in other words, a plurality of vacuum chambers.

Figure 6:
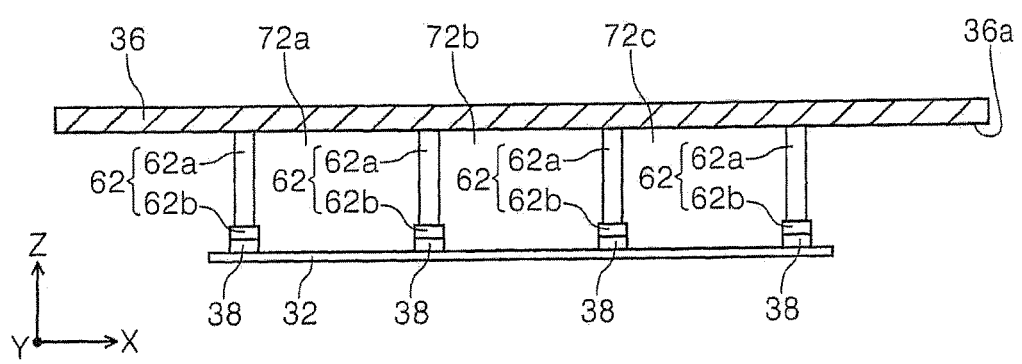
FIG. 6 is an explanatory view illustrating the effect of the first embodiment.

As a result, as shown in FIG. 6, when the signal detection means detects contact between the anchor portions 38 and the corresponding anchor abutment portions 62b, the degree of vacuum (negative pressure) in the vacuum chambers 72a, 72b, 72c of the first vacuum chamber 72 adjacent to the contacted anchor portions 38 is maintained at the same level as detected at the time of contact. Thus, because the degree of vacuum (negative pressure) in each vacuum chamber is not increased excessively, the portions of the probe card 32 corresponding to the vacuum chambers are prevented from being bent (deformed) toward the pogo pin block 34.

Therefore, the relative position between the portions of the probe card 32 corresponding to the vacuum chambers and the plane reference body 36 is determined. Thus, the portions of the probe card 32 corresponding to the vacuum chambers follow the plane formed by the plane reference body 36.

Thus, the flatness of the probe card 32 is in accordance with the flat surface 36a of the plane reference body 36. As a result, the flatness of the XY plane formed by the tips of the probes 30 of the probe card 32 is also in accordance with the flat surface 36a of the plane reference body 36, and it satisfies a prescribed flatness requirement (such as 30 µm or less).

In addition, the probe card 32 can be easily removed from the pogo pin block 34 by returning the degrees of vacuum (negative pressures) in the vacuum chambers of the first vacuum chamber 72 and the space 71 to atmospheric pressure with the pressure adjusting means 64 and the other pressure adjusting means (not shown). In other words, the probe card 32 is separable from the pogo pin block 34.

[Control System]

Figure 7:
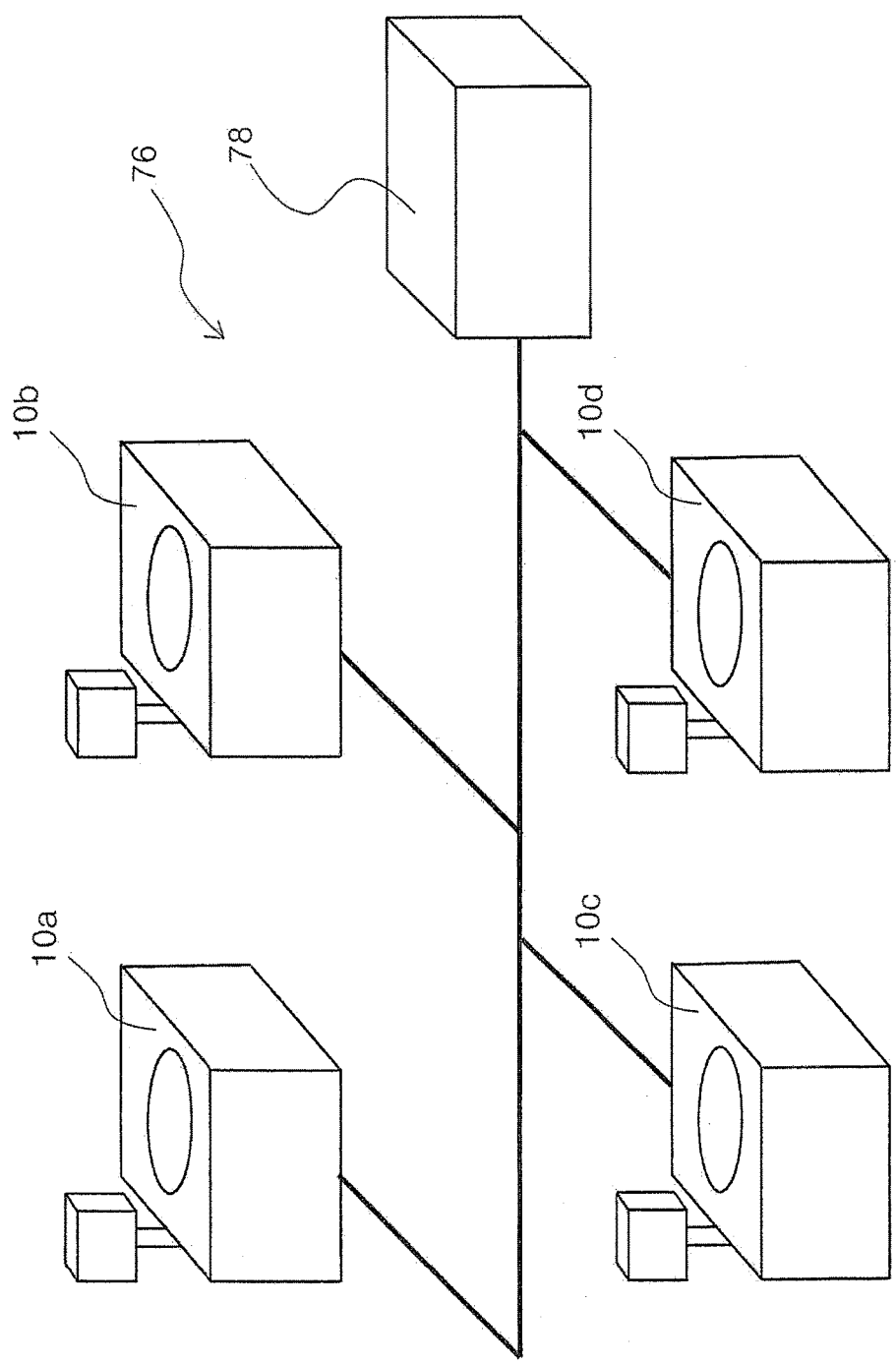
FIG. 7 is a schematic view of a control system for inspection devices according to the first embodiment.

A control system 76 for controlling a plurality of inspection devices 10a, 10b, 10c, 10d is next described in detail with reference to FIG. 7. The control system 76 includes a control part 78 electrically connected to the inspection devices 10a, 10b, 10c, 10d.

When the probe card 32 is attached to the inspection devices 10a, 10b, 10c, 10d, the control part 78 controls the degrees of vacuum (negative pressures) in the vacuum chambers of the first vacuum chamber 72 of the probe card 32. The control part 78 also controls the degrees of vacuum (negative pressures) in the vacuum chamber, so that the degrees of vacuum in the vacuum chambers reach the respective set values of degree of vacuum determined during the production process of the probe card 32.

The set values of degree of vacuum for the respective vacuum chambers are values determined during the production process of the probe card 32. Specifically, the degrees of vacuum in the vacuum chambers, which are detected by the pressure sensors 65 of the pressure adjusting means 64 when the anchor portions 38 are brought into contact with the anchor abutment portions 62b using a jig that can create an environment similar to the measurement environment of the inspection device 10 during the production process of the probe card 32, are used as the set values of degree of vacuum for the vacuum chambers. The set values of degree of vacuum are set in such a range that the probe card 32 can satisfy a prescribed flatness requirement (such as 30 µm or less).

In addition, the set values of degree of vacuum for the vacuum chambers of the first vacuum chamber 72 determined during the production process of the probe card 32 are provided to the user who uses the probe card in a printed or electronic medium or via telecommunication means together with the probe card 32.

The control part 78 includes a storage device (such as a hard disk drive or built-in memory) (not shown) so that the set values of degree of vacuum for the vacuum chambers of the probe card 32 can be stored in the storage device.

Thus, when the probe card 32 already attached to one of the inspection devices 10a, 10b, 10c, 10d is attached to another one of the inspection devices 10a, 10b, 10c, 10d, the control part 78 sends, to said other inspection devices 10a, 10b, 10c, 10d, the set values of degree of vacuum for the vacuum chambers of the first vacuum chamber 72 of the newly attached probe card 32. Accordingly, the control part 78 controls the degrees of vacuum (negative pressures) in the vacuum chambers of the first vacuum chamber 72 of the probe card 32.

Thus, the measurement environment of the probe card 32 can be easily reproduced in any of the inspection devices 10a, 10b, 10c, 10d.

Modification of First Embodiment (1) In this embodiment, the vacuum chambers of the first vacuum chamber 72 and the vacuum chambers of the second vacuum chamber 74 may be arranged in an asymmetric relationship instead of a plane-symmetric relationship.

(2) In this embodiment, instead of the anchor portions 38 and the anchor receivers 62 for determining the relative position between the probe card 32, the pogo pin block 34, and the plane reference body 36, the seal members 50 located between the probe card 32 and the pogo pin block 34, and the seal members 50 located between the pogo pin block 34 and the plane reference body 36 may be used as members for determining the relative position between the probe card 32, the pogo pin block 34, and the plane reference body 36.

Specifically, the seal members 50 may be modified not to deform beyond a certain limit in the Z-axis direction so that the relative position between the probe card 32, the pogo pin block 34, and the plane reference body 36 can be determined when the degrees of vacuum in the vacuum chambers of the first vacuum chamber 72 and the vacuum chambers of the second vacuum chamber 74 reach respective set values.

(3) The inspection device 10 may be modified to store the set values of degree of vacuum for the vacuum chambers of the probe card 32 and to control the degrees of vacuum (negative pressures) in the vacuum chambers of the probe card 32.

(4) In this embodiment, the pogo pin block 34 and the plane reference body 36 are assembled to the probe card 32. However, the plane reference body 36 may be attached to the tester 14 to form a reference plane, and the probe card 32 and the pogo pin block 34 may be assembled to the plane reference body 36.

(5) The anchor portions 38 of the probe card 32, which have a circular columnar shape in this embodiment, may instead have the shape of a rectangular block. The pogo pin blocks 34 may have a cylindrical shape with notches formed in a circumferentially spaced relationship in inside and outside diameter portions thereof, and the anchor portions 38 may be formed as members which can be fitted in the notches.

(6) In the above embodiment, the pogo pin block serves as the connection body. However, the plane reference body may serve as the connection body. For example, this is applicable when the pogo pin block is small in size as shown in FIG. 1 of JP 2012-163410 A or when the pogo pin block is constituted with a plurality of small blocks.

Second Embodiment

Figure 8:
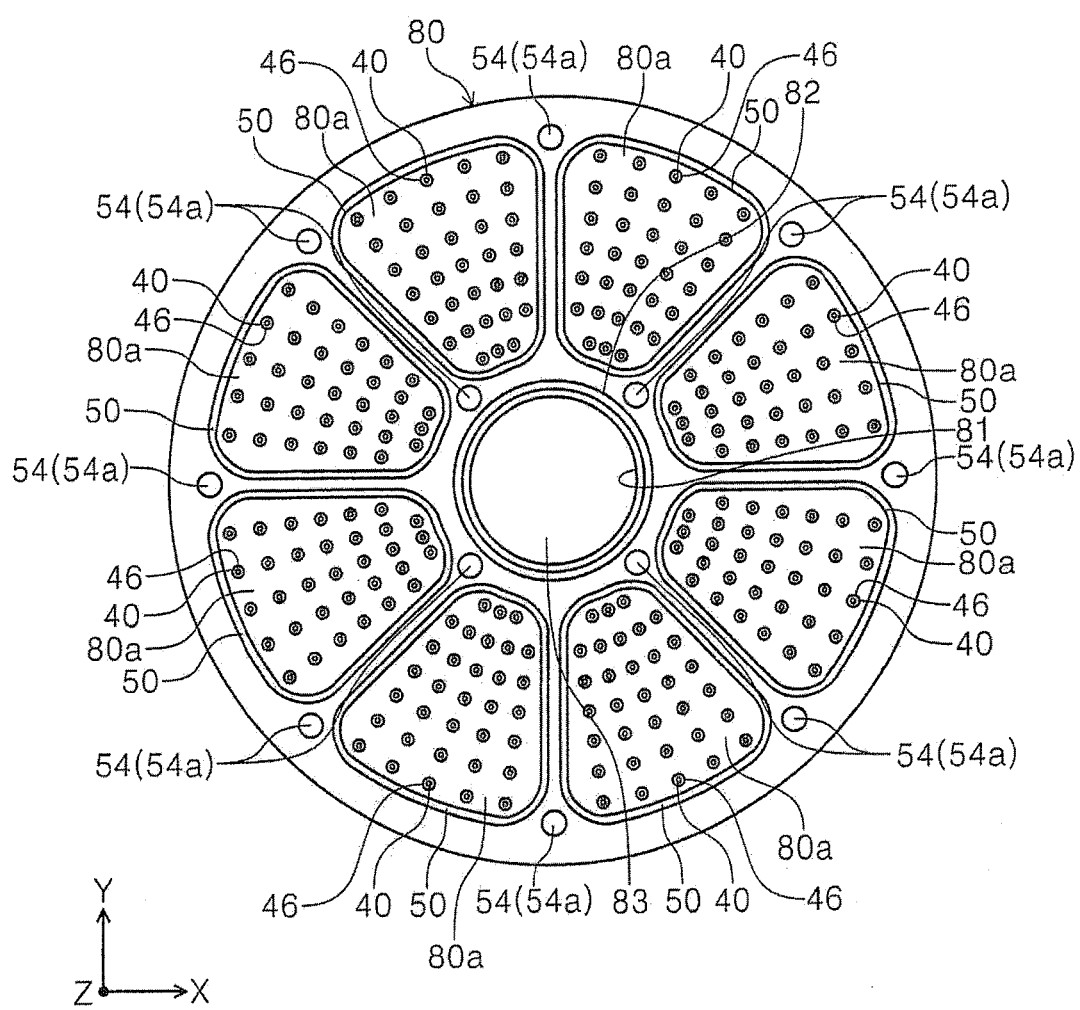
FIG. 8 is a plan view of a connection body according to a second embodiment.

The inspection unit 22 according to a second embodiment is described with reference to FIG. 8. The inspection unit 22 according to the second embodiment is different from that of the first embodiment in that the vacuum chambers of the first vacuum chamber 72 are not communicated with the vacuum chambers of the second vacuum chamber 74.

A pogo pin block 80 includes, on upper and lower surfaces thereof, a plurality of regions 80a, which are arranged circumferentially at regular intervals and surrounded by the seal members 50. The regions 80a formed on the lower surface of the pogo pin block 80 define the plurality of vacuum chambers of the first vacuum chamber 72 when the probe card 32 and the pogo pin block 80 are united together. The regions 80a formed on the upper surface of the pogo pin block 80 define the plurality of vacuum chambers of the second vacuum chamber 74 when the probe card 32 and the pogo pin block 80 are united together.

Although not shown, the adjusting means 64 are provided in plural numbers corresponding to the vacuum chambers of the first vacuum chamber 72 and the vacuum chambers of the second vacuum chamber 74. The pogo pin block 80 includes, at its center, a through hole 81 extending in the Z-axis direction. An annular seal member 82 is provided on each of the upper and lower surfaces of the pogo pin block 80 to surround the through hole 81. Thus, a space 83 surrounded by the seal members 82 is formed in the through hole 81 when the probe card 32 and the pogo pin block 80 are united together. The space 83 is brought into a vacuum state by another pressure adjusting means (not shown). The degree of vacuum (negative pressure) in the space 83 is set to be equal to or lower than the lowest of the degrees of vacuum (negative pressures) in the vacuum chambers of the first vacuum chamber 72.

Third Embodiment

Figure 9:
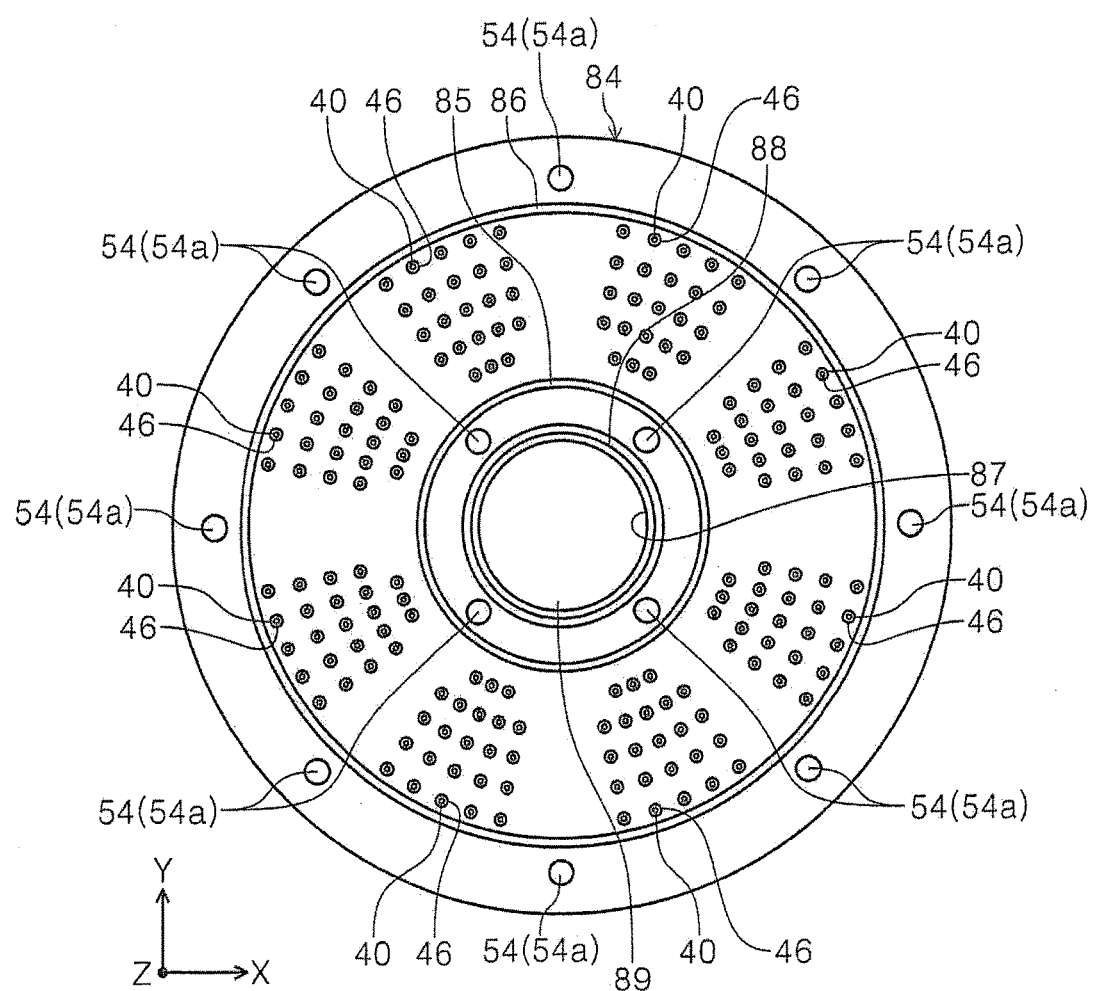
FIG. 9 is a plan view of a connection body according to a third embodiment.
Figure 10:
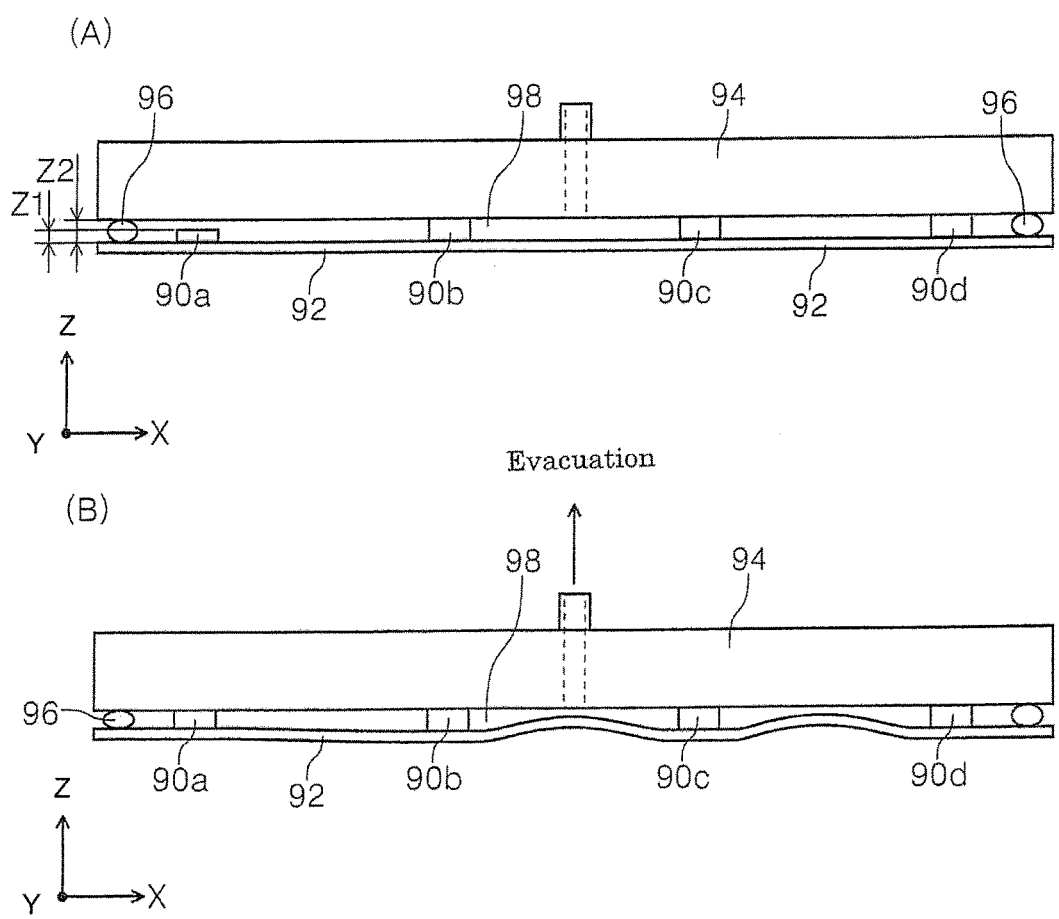
FIG. 10(A) is an explanatory view illustrating the problem of a probe card according to a related art.
FIG. 10(B) is an explanatory view illustrating the problem of the probe card according to the related art.

The inspection unit 22 according to a third embodiment is described with reference to FIG. 9. The inspection unit 22 according to the third embodiment is different from that of the first embodiment in that the second vacuum chamber 74 is formed with one vacuum chamber, and the vacuum chambers of the first vacuum chamber 72 are not communicated with the second vacuum chamber 74.

The constitution on the lower surface of a pogo pin block 84 is the same as that in the first embodiment. Thus, the pogo pins 40 provided through the pogo pin block 84 are arranged corresponding to the plurality of regions formed on the lower surface of the pogo pin block 84. An annular seal member 85 located on the inner peripheral side and an annular seal member 86 located on the outer peripheral side are provided on the upper surface of the pogo pin block 84.

In a region 84a between the seal members 85 and 86A, the plurality of pogo pins 40 are arranged corresponding to the plurality of regions.

The region 84a between the seal members 85 and 86 defines the second vacuum chamber 74 when the pogo pin block 84 and the probe card 32 are united together. In this embodiment, the second vacuum chamber is constituted as a single vacuum chamber. Although not shown, the pressure adjusting means 64 are provided in plural numbers corresponding to the vacuum chambers of the first vacuum chamber 72 and the vacuum chamber of the second vacuum chamber 74.

The pogo pin block 84 includes, at its center, a through hole 87 extending in the Z-axis direction. An annular seal member 88 is provided on each of the upper and lower surfaces of the pogo pin block 84 to surround the through hole 87. Thus, a space 89 surrounded by the seal members 88 is formed in the through hole 87 when the probe card 32 and the pogo pin block 84 are united together. The space 89 is brought into a vacuum state by another pressure adjusting means (not shown). The degree of vacuum (negative pressure) in the space 89 is set to be equal to or lower than the lowest of the degrees of vacuum (negative pressures) in the vacuum chambers of the first vacuum chamber 72.

To summarize the above description, the inspection unit 22 of this embodiment includes the probe card 32 having probes 30 on the first surface, the pogo pin block 34, 80, 84 united with the second surface of the probe card 32 via the first vacuum chamber 72, and the first vacuum chamber 72 is formed with the plurality of chambers.

The first vacuum chamber 72 is formed such that the degrees of vacuum (negative pressures) in the vacuum chambers can be individually controlled. The inspection unit 22 includes, the pressure sensor 65 provided in each vacuum chamber of the first vacuum chamber 72, and a vacuum regulator 67 for adjusting the degree of vacuum therein to a degree of vacuum set for the vacuum chamber using a detection value detected by the pressure sensor 65.

The inspection unit 22 includes a plane reference body 36, which is located on the opposite side of the probe card 32 with respect to the pogo pin block 34, 80, 84, and a flat surface facing the pogo pin block 34, 80, 84. The probe card 32 includes anchor portions 38 as a plurality of first reference bodies protruding from the second surface toward the plane reference body 36. The plane reference body 36 includes anchor receivers 62 as the plurality of second reference bodies protruding from the flat surface 36a toward the probe card 32. The anchor portions 38 are brought into contact with the anchor receivers 62 to determine the relative position between the probe card 32 and the plane reference body 36.

The pogo pin block 34, 80, 84 and the plane reference body 36 are united together via the second vacuum chamber 74. The second vacuum chamber 74 is formed with a plurality of chambers. The first vacuum chamber 72 and the second vacuum chamber 74 are communicated with each other. The probe card 32 and the pogo pin block 34, 80, 84 are separable from each other.

The probe card 32 includes a first surface on which probes 30 are mounted, and a second surface to be united with the pogo pin block 34, 80, 84 via a plurality of vacuum chambers 72 set to have respective degrees of vacuum. The probe card 32 has set values of degree of vacuum for respective vacuum chambers 72 determined during the production process of the probe card.

The inspection device 10 includes the inspection unit 22, the prober 12 having the stage 18 on which the test object 26 to be brought into contact with the probes 30 of the probe card 32 is mounted, and the tester 14 electrically connected to the plane reference body 36. The probe card 32 of the inspection unit 22 is attached to the prober 12.

A control system 76 includes the plurality of inspection devices 10a, 10b, 10c, 10d, and the control part 78 for controlling the inspection devices. The control part 78 has set values of degree of vacuum for respective vacuum chambers of the first vacuum chamber 72 of an inspection unit 22, and sets degrees of vacuum (negative pressures) for respective vacuum chambers based on the set values when the inspection unit 22 is attached to the inspection device 10a, 10b, 10c, 10d.

It goes without saying that the present invention is not limited to the above embodiments and various modification are possible within the scope of the invention set forth in the claims and such modifications are also included in the scope of the present invention.

DESCRIPTION OF REFERENCE NUMERALS AND SYMBOLS 10, 10a, 10b, 10c, 10d: inspection device
12: prober
14: tester
16: test object transport mechanism
18: inspection stage
20: chuck top
22: inspection unit
24: mounting surface
26: test object
28: card holder
30: probe
32, 92: probe card
34, 80, 84: pogo pin block
34a, 80a, 84a: region
36: plane reference body
36a: flat surface
38: anchor portion
40: pogo pin
42: connection land
44: probe card's height-and-flatness reference portion
46: pogo pin insertion hole
50, 51, 82, 85, 86, 88, 96: seal member
52: communication hole
47, 54, 81, 87: through hole
54a: small-diameter portion
54b: large-diameter portion
56: tester damper
58: printed circuit board
60: connection cable
62: anchor receiver
62a: columnar portion
62b: anchor abutment portion
64: pressure adjusting means
65: pressure sensor
66: vacuum chamber
67: vacuum regulator
68, 70, 71, 83, 89, 98: space
72: first vacuum chamber
72a, 72b, 72c: vacuum chamber of first vacuum chamber
74: second vacuum chamber
76: control system
78: control part
90, 90a, 90b, 90c, 90d: anchor
94: reference body
Z1, Z2: length of protrusion of anchor

The invention claimed is:

1. An inspection unit, comprising:
   a probe card having a probe on a first surface thereof; and
   a connection body united with a second surface of the probe card via a first vacuum chamber,
   wherein the first vacuum chamber is formed with a plurality of vacuum chambers,
   a degree of vacuum in each of the plurality of vacuum chambers can be individually controlled, and
   each of the plurality of vacuum chambers is surrounded by a seal member, which is spaced away from an adjacent seal member that surrounds an adjacent vacuum chamber, whereby the probe card and the connection body are united such that a plurality of seal members come into direct contact with the probe card.

2. The inspection unit according to claim 1, further comprising:
   a pressure sensor provided in each vacuum chamber of the first vacuum chamber; and
   a vacuum regulator for adjusting the degree of vacuum in each vacuum chamber to a degree of vacuum set for each vacuum chamber using a detection value detected by the pressure sensor.

3. The inspection unit according to claim 1, further comprising a plane reference body, which is located on the opposite side of the probe card with respect to the connection body and which includes a flat surface facing the connection body,
   wherein the probe card includes a plurality of first reference bodies protruding from the second surface toward the plane reference body,
   the plane reference body includes a plurality of second reference bodies protruding from the flat surface toward the probe card, and
   the first reference bodies are brought into contact with the second reference bodies to determine the relative position between the probe card and the plane reference body.

4. The inspection unit according to claim 2, further comprising a plane reference body, which is located on the opposite side of the probe card with respect to the connection body and which includes a flat surface facing the connection body,
   wherein the probe card includes a plurality of first reference bodies protruding from the second surface toward the plane reference body,
   the plane reference body includes a plurality of second reference bodies protruding from the flat surface toward the probe card, and
   the first reference bodies are brought into contact with the second reference bodies to determine the relative position between the probe card and the plane reference body.

5. The inspection unit according to claim 3, wherein the connection body and the plane reference body are united together via a second vacuum chamber.

6. The inspection unit according to claim 5, wherein the second vacuum chamber is formed with a plurality of chambers.

7. The inspection unit according to claim 6, wherein the first vacuum chamber and the second vacuum chamber are communicated with each other.

8. The inspection unit according to claim 1, wherein the probe card and the connection body are separable from each other.

9. The inspection unit according to claim 2, wherein the probe card and the connection body are separable from each other.

10. The inspection unit according to claim 3, wherein the probe card and the connection body are separable from each other.

11. The inspection unit according to claim 5, wherein the probe card and the connection body are separable from each other.

12. The inspection unit according to claim 6, wherein the probe card and the connection body are separable from each other.

13. The inspection unit according to claim 7, wherein the probe card and the connection body are separable from each other.

14. A probe card comprising:
    a unitary body having a first surface on which probes are mounted; and
    a second surface of the unitary body to be united with a connection body via a plurality of vacuum chambers set to have respective degrees of vacuum, which can be individually controlled,
    wherein the probe card includes set values of degree of vacuum for respective vacuum chambers determined during the production process of the probe card, and
    each of the plurality of vacuum chambers is surrounded by a seal member, which is spaced away from an adjacent seal member that surrounds an adjacent vacuum chamber, whereby the probe card and the connection body are united such that a plurality of seal members come into direct contact with the probe card.

15. An inspection device, comprising:
    an inspection unit according to claim 1;
    a prober including a stage, on which a test object to be brought into contact with the probe of the probe card is mounted; and
    a tester electrically connected to the plane reference body;
    wherein the probe card of the inspection unit is attached to the prober.

16. A control system for inspection devices, comprising:
    a plurality of inspection devices as set forth in claim 15; and
    a control part for controlling the inspection devices,
    wherein the control part includes a set value of degree of vacuum for each of the vacuum chambers of the first vacuum chamber in the inspection unit, and the degree of vacuum in each of the respective vacuum chambers is set based on the set value when the inspection unit is attached to the inspection device.

17. The inspection unit according claim 1, wherein, each seal member is provided on the connection body around each of the plurality of vacuum chambers.

* * * * *